United States Patent
Card, Jr. et al.

(10) Patent No.: US 6,216,938 B1
(45) Date of Patent: Apr. 17, 2001

(54) MACHINE AND PROCESS FOR REWORKING CIRCUIT BOARDS

(75) Inventors: Norman A. Card, Jr., Lockwood, NY (US); James M. Ergler, Friendsville, PA (US); James D. Herard, Vestal, NY (US); Paul R. Kasperek, Owego, NY (US); Richard S. McKinley; Der-jin Woan, both of Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/409,832

(22) Filed: Sep. 30, 1999

(51) Int. Cl.$^7$ .............................. B23K 1/018; B23K 31/02
(52) U.S. Cl. .......................... 228/20.1; 228/21; 228/119; 228/264
(58) Field of Search ................... 228/119, 264, 228/20.1, 21

(56) References Cited

U.S. PATENT DOCUMENTS

| | | | |
|---|---|---|---|
| 3,629,543 | * 12/1971 | Mayhew et al. | 219/85 |
| 3,644,980 | * 2/1972 | Class, Jr. et al. | 29/203 B |
| 3,661,315 | * 5/1972 | Helton | 228/20 |
| 3,690,539 | 9/1972 | Geiger . | |
| 3,865,298 | * 2/1975 | Allen et al. | 228/20 |
| 3,924,794 | * 12/1975 | Allen et al. | 228/256 |
| 3,987,854 | 10/1976 | Callihan et al. . | |
| 4,022,370 | * 5/1977 | Durney | 228/5.1 |
| 4,083,323 | * 4/1978 | Rote | 118/6 |
| 4,366,925 | * 1/1983 | Fanene | 228/20 |
| 4,402,448 | * 9/1983 | O'Rourke | 228/125 |
| 4,419,566 | 12/1983 | Fortune . | |
| 4,426,571 | * 1/1984 | Beck | 219/373 |
| 4,569,473 | * 2/1986 | Guiliano | 228/264 |
| 4,602,733 | * 7/1986 | Slack et al. | 228/242 |
| 4,605,152 | * 8/1986 | Fridman | 228/6.2 |
| 4,610,388 | * 9/1986 | Koltuniak et al. | 228/6.2 |
| 4,619,841 | * 10/1986 | Schwerin | 427/96 |
| 4,620,659 | * 11/1986 | Holdway | 228/20 |
| 4,659,004 | * 4/1987 | Fridman | 228/6.2 |
| 4,696,096 | * 9/1987 | Green et al. | 29/829 |
| 4,750,664 | * 6/1988 | Futek | 228/102 |
| 4,817,851 | * 4/1989 | Kolesar et al. | 228/219 |
| 4,832,249 | * 5/1989 | Ehler | 228/102 |
| 4,847,465 | * 7/1989 | Toyama et al. | 219/85.1 |
| 4,912,857 | * 4/1990 | Parent et al. | 34/148 |
| 4,971,554 | * 11/1990 | Moore | 432/19 |
| 4,972,990 | * 11/1990 | Abbagnaro et al. | 228/20 |
| 5,031,820 | 7/1991 | Jacks et al. . | |
| 5,402,563 | * 4/1995 | Satoh et al. | 29/829 |
| 5,617,989 | * 4/1997 | Kelzer | 228/125 |
| 5,758,815 | 6/1998 | French et al. . | |
| 5,911,355 | * 6/1999 | Tauchmann et al. | 228/125 |

* cited by examiner

Primary Examiner—Patrick Ryan
Assistant Examiner—Kiley Stoner
(74) Attorney, Agent, or Firm—Salzman & Levy; Lawrence R. Fraley

(57) ABSTRACT

A method and apparatus is described for reworking a printed circuit board having plugged vias and plated through holes. The printed circuit board, supported by a movable local support, is heated from only the bottom side by a heating device near the area on the PCB that contains the plated through hole or holes to be reworked. The heating device is removed when the solder in the plugged PTH is completely melted. At that time, blast air is turned on to remove and blow off the excess solder in the PTH. The compressed air is more effective in displacing the molten solder than is vacuuming, and has less chance of damaging the PCB than do conventional reworking methods, due to the non-contact nature of the invention.

10 Claims, 3 Drawing Sheets

MACHINE AND PROCESS FOR REWORKING CIRCUIT BOARDS

FIELD OF THE INVENTION

This invention relates to printed circuit boards and, more particularly, to a machine and process for reworking defective printed circuit boards whose vias and plated through holes (PTHS) have become plugged by excessive solder.

BACKGROUND OF THE INVENTION

In the past, defective printed circuit boards have been recycled by using a hot air solder leveling tool to clear solder-plugged vias and plated through holes (PTHs). Such a process, however, required prolonged heating of the entire printed circuit board. The prolonged heating often damaged the circuit board, so the proposed process could never be implemented reliably.

The present invention is a new machine and method for clearing the plugged vias and PTHs of printed circuit boards. The new machine and reworking process utilize localized slow heating of the PTHs that minimizes thermal shock. In addition, the invention does not physically contact the PTHs and surrounding land, thus avoiding or minimizing damage to the metal plating during the reworking process. A plugged hole on the defective panel is heated from below by convection; a subsequent air blast clears the molten solder therefrom.

DISCUSSION OF RELATED ART

In U.S. Pat. No. 3,690,539, issued to Geiger Sep. 12, 1972 for HEAT AND AIR ACTION APPARATUS FOR ELECTRONIC CIRCUITRY REPAIRS, a heat and air suction apparatus is described that can be used for repair of electronic circuitry. The device is capable of melting the solder. An air conduit links a hollow heater tip to an air connection. The conduit has a solid matter separator.

In U.S. Pat. No. 3,987,854, issued to Callihan et al on Oct. 26, 1976 for GRAVEL PACKING APPARATUS AND METHOD, a solder removal device is shown. The device has a handle with a venturi mechanism for creating a vacuum. The vacuum is applied to a solder collection chamber which, in turn, is heated by hot air. A jet of hot air is directed from a tube that melts and blows the solder away.

In U.S. Pat. No. 4,419,566, issued to Fortune on Dec. 6, 1983 for HOT AIR SOLDERING AND RESOLDERING SYSTEM, means are illustrated for issuing hot air from a jet tip having an axial bore. The air is heated to liquefy a small amount of solder, thereby allowing soldering and desoldering to occur.

In U.S. Pat. No. 5,031,820, issued on Jul. 16, 1991 to Jacks et al for PCB REWORK STATION, a rework station for soldering/desoldering of integrated circuits on a printed circuit board is illustrated. A base supported gantry directs hot gas delivery and a vacuum over a printed circuit board.

In U.S. Pat. No. 5,758,815, issued to French et al on Jun. 12, 1998 for SOLDER APPARATUS AND METHOD, an apparatus and method is described for soldering pin-in-hole electronic circuit components on a printed circuit board. Hot gases are directed through a matrix of holes and aligned vias, in order to reflow solder in the vias. The device provides localized heating to the solder joint, so that the board is not burned and other components are not reflowed.

SUMMARY OF THE INVENTION

In accordance with the present invention, there is provided a machine and method for repairing printed circuit boards whose vias and plated through holes (PTHs) have become plugged by solder. The machine comprises an adjustable, movable support for holding the printed circuit board that includes defective PTHs. The support positions the defective area of the printed circuit board under an air nozzle. A heating device positioned below the defective area heats the board to at least 420° F., for approximately five minutes or less. The heat melts the solder in the PTHs; the air nozzle blows the melted solder into a collection pan disposed below the printed circuit board. A solenoid or stepper motor is controlled by a timed switch or computer. The computer actuates the solenoid to activate an air valve which supplies compressed air to the air nozzle after moving the heating device away from the defective area.

The printed circuit board is heated from the bottom side. A compressed air blast is applied to the board when the solder in the PTHs is in a molten state, as aforementioned. The compressed air is more effective than is vacuuming in displacing molten solder. The defective area is masked to prevent solder splash back and to localize the defective area. The heating device is adjustably positioned a given distance from the board to provide localized heating thereto. The heat is automatically withdrawn from the defective area, while cool blasting air is allowed to blow over the affected area and through the PTHs.

The process of this invention comprises the following steps:

a) taping the printed circuit board (PCB) with a high temperature tape to expose only the defective area containing a solder plugged PTH;

b) adjusting a movable support to fit the size of PCB that is to be reworked;

c) placing a heating device proximate the defective PTH area;

d) heating the PCB about the defective PTH area until sollder in the PTH is substantially completely melted;

e) removing the heating device from the defective PTH area; and f) applying air under pressure to the defective PTH area to carry away excessive molten solder from the PTH and to cool the PCB.

It is an object of this invention to provide an improved printed circuit board reworking apparatus and method.

It is another object of the invention to provide a reworking apparatus and method for removing solder from plugged plated through holes disposed upon printed circuit boards.

BRIEF DESCRIPTION OF THE DRAWING

A complete understanding of the present invention may be obtained by reference to the accompanying drawing, when considered in conjunction with the subsequent detailed description, in which.

DESCRIPTION OF THE PREFERRED EMBODIMENT

Generally speaking, the invention features a method and apparatus for reworking a printed circuit board having plugged vias and plated through holes. The printed circuit board, locally supported by a movable support, is heated from the bottom side by a heating device that is disposed proximate the area on the PCB that contains the plated through hole or holes to be reworked. The heating device is removed and turned off when the solder in the plugged PTH is completely melted. At that time, blast air is turned on to remove and blow off the excess solder in the PTH. The compressed air is more effective in displacing the molten solder than is vacuuming, and has less chance of damaging the PCB than do conventional reworking methods, due to the non-contact nature of the present invention.

Figure 1:
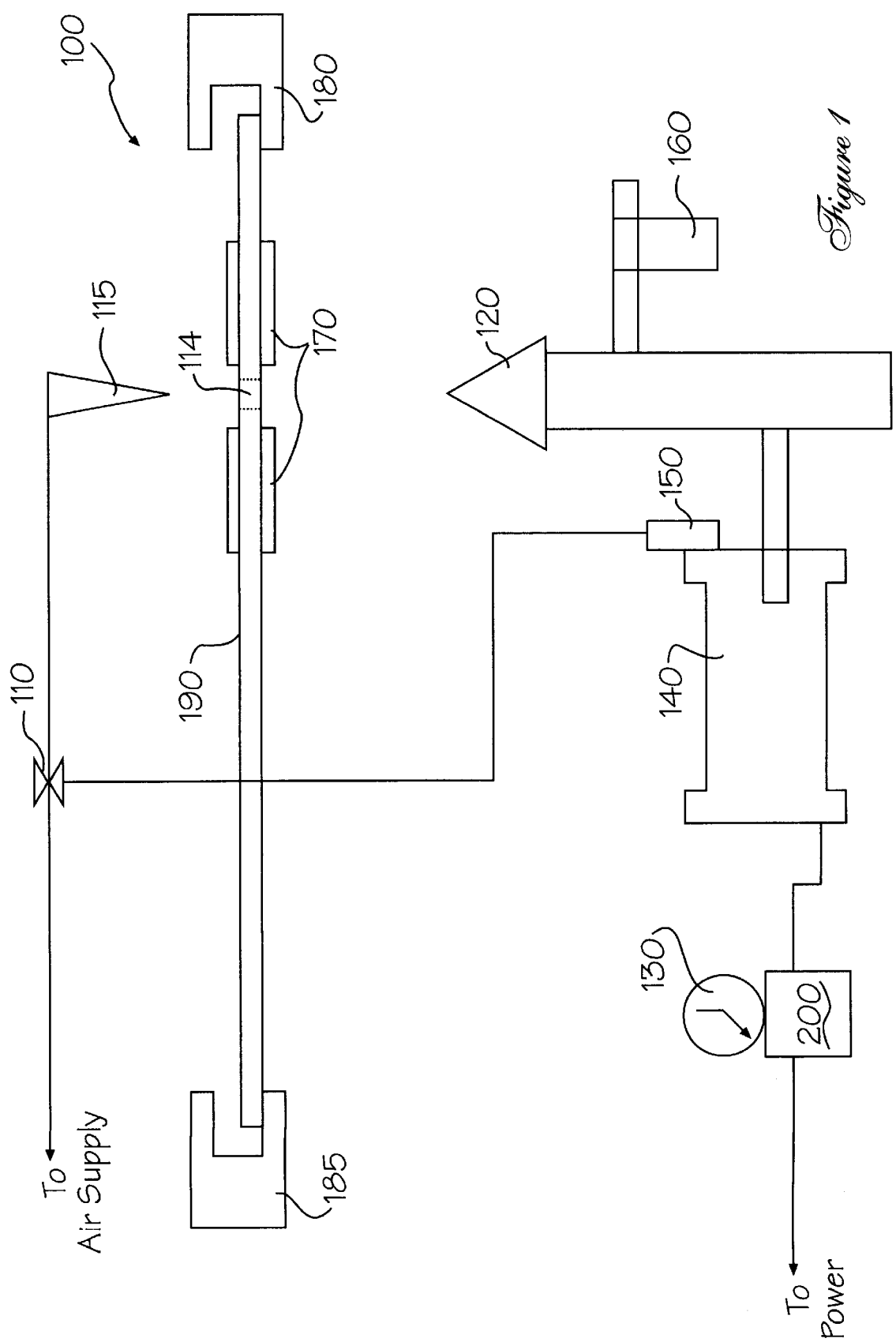
FIG. 1 illustrates a schematic diagram of an apparatus for reworking defective circuit boards having plugged plated through holes, in accordance with this invention.

Now referring to FIG. 1, a schematic diagram illustrates the machine 100 for reworking defective printed circuit cards and boards (PCBs) 190 having plugged plated through holes (PTHs) 114. The machine 100 comprises an adjustable support comprising movable rails 180 and 185, respectively. The movable rails 180 and 185 and local support fixture described hereinbelow hold the printed circuit board 190 with the defective PTH 114 under an air nozzle 115. The defective area 114 is masked with high temperature tape 170 to prevent back splash and damage to the surrounding area. When working with PTHs disposed on relatively thin PCBs, cross bars, described below, can be added for additional local support to prevent the PCBs from sagging during heating.

A heating device 120 positioned below the defective area heats the board 190 to at least 420° F., for approximately five minutes or less. The heat melts the solder in the hole 114. After the heating device 120 is moved away from the defective PTH 114 and a collection pan 160 is moved into position below the defective PTH 114 by a solenoid 140, described hereinbelow, the air nozzle 115 blows the melted solder into collection pan 160 disposed.

The solenoid or stepper motor 140 is controlled by a timing device 130 or a computer 200 that actuates a main power switch to solenoid 140. The computer 200 or a contact switch 150 activates an air valve 110 supplying compressed air to the air nozzle 115, after moving the heating device 120 away from the defective plugged hole 114. The air blast provided by air valve 110 through nozzle 115 is shut off after a predetermined time.

Figure 2A:
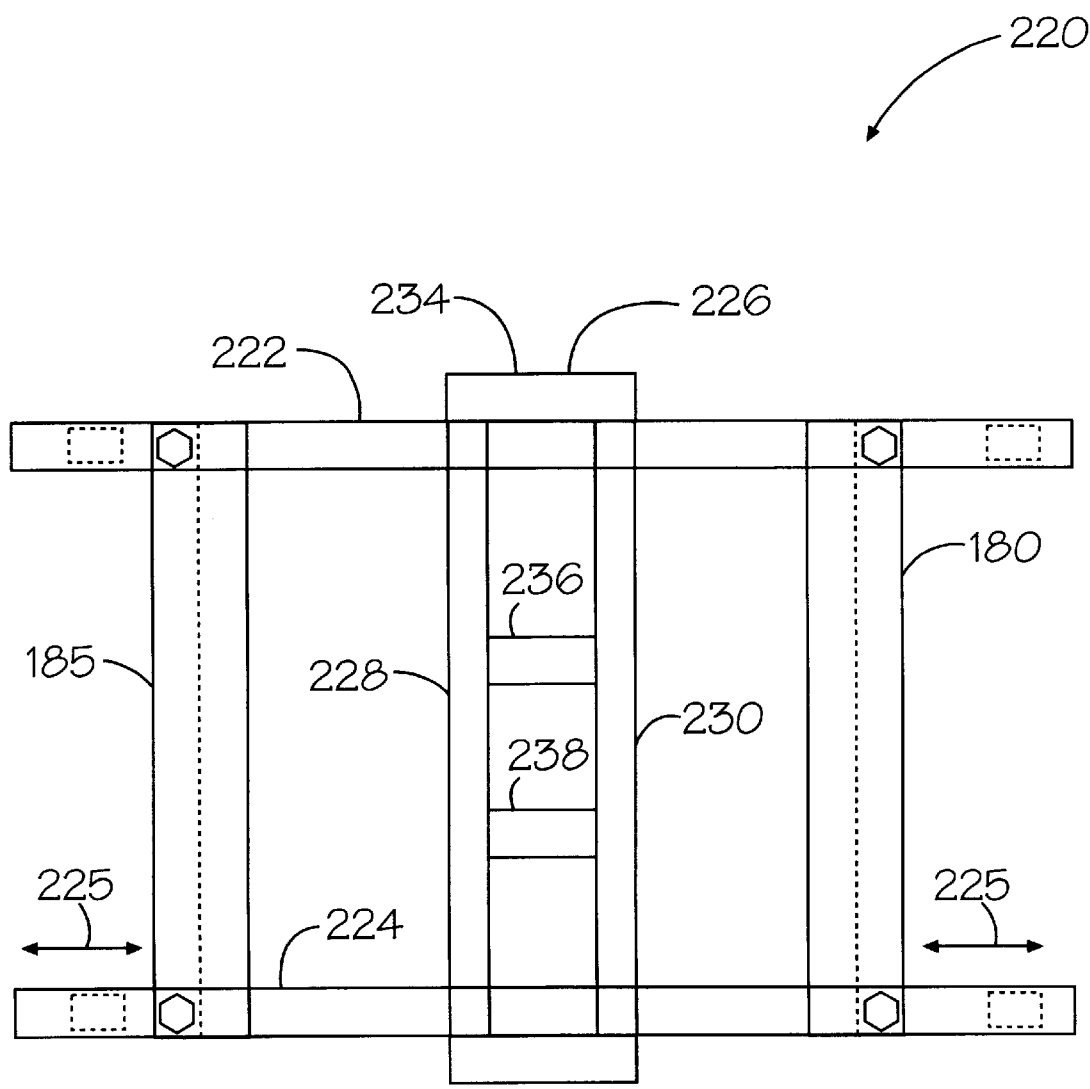
FIGS. 2a and 2b depict top and side views, respectively, of the support fixture of the present invention.
Figure 2B:
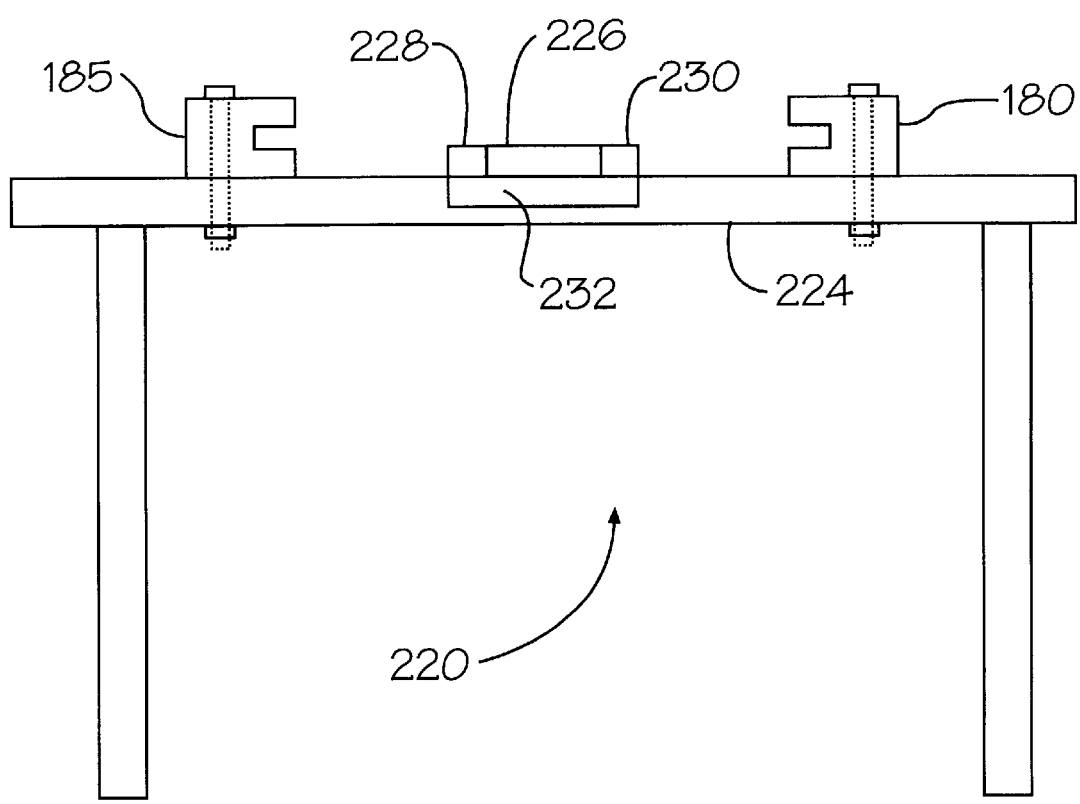

Referring now also to FIGS. 2a and 2b, a support fixture 220 has two parallel sides 222 and 224, on which are transversely mounted the movable rails 180 and 185, respectively. The movable rails 180 and 185 are adapted to move relative to, and along the length of, sides 222 and 224 (arrows 225). A local PCB support 226 is also independently and movably mounted on sides 222 and 224. Local support 226 has two side rails 228 and 230 connected to each other by cross members 232 and 234, which restrict the support 226 to move in the direction shown by arrows 225, preventing support 226 from sliding perpendicularly to the aforesaid direction (arrows 225).

Two additional support beams 236 and 238 are each disposed on side rails 228 and 230 for providing local support to the portion of the PCB 190 (FIG. 1) being reworked. This is an important function because, as aforementioned, a long expanse of heated substrate (e.g., PCB substrate) tends to sag, especially when the substrate is relatively thin and is heated. In the present invention, such sagging is a particularly problematical due to the possibility of overheating the PTHs 114 and/or components, if any, mounted on the PCB 190.

The Process:
1. Tape the PCB 190 with a high temperature tape 170 to expose only the defective PTH 114.
2. Adjust the rails 180 and 185 to fit the size of PCB 190 to be reworked.
3. Set up the PCB 190 as shown in FIG. 1 with air nozzle 115 aiming at the defective PTH 114 to be heated. The tip of air nozzle to board distance is preferably about 0.125 inch, but other distances, such as between 0.062 to 1.0 inch, could also be used. The heating device 120 can comprise a hot air gun whose tip to board distance is preferably about one inch, but can be adjustable for different temperature requirements and for different types of PCBs. The air pressure is adjustable, preferably in the range from 5 psi to 120 psi, 60 psi being used for most situations.
4. Move the adjustable local support 226 into position.
5. Set the timer 130, which is adjustable for PCBs with different thicknesses or different sizes of PTHs, but is typically 2 to 3 minutes for a 40 mil PTH on a 0.1 inch thick PCB.
6. When either predetermined time (monitored by a timer) or temperature (monitored by a thermocouple) is reached, move the heating device 120 away, and bring an optional catch pan 160 into position by the solenoid or stepping motor 140 or manually.
7. Open the valve 110 for compressed air, either through a limiting switch 150 or manually, to blow away excessive solder in the defective PTH area 114.
8. Touch up to smooth any uneven or rough solder on the annular ring around the PTH 114. This step is optional, as required.
9. Either wipe clean or use an automatic in-line spraying tool to clean the PCB.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. An apparatus for reworking a defective printed circuit board (PCB) having solder-plugged plated through holes (PTHs), said apparatus for cleaning said solder from said solder-plugged plated through holes, comprising:

movable supporting means for carrying said defective PCB to be reworked;

air supplying means disposed adjacent solder-plugged plated through holes carried by said defective PCB for providing air under pressure to said solder-plugged plated through holes of said defective area of said PCB to remove excess solder from said solder-plugged plated through holes of said defective area, and to cool said PCB;

heat protective means surrounding said defective area of said PCB to prevent solder splashing upon, and damage to, non-defective areas of said PCB;

heating means disposed below said PCB for locally heating said defective area to cause the solder in said solder-plugged plated through holes to melt; and control means operatively connected to said heating means and to said air supplying means, said control means operatively controlling said heating means and said air supplying means in a proper operational sequence, so that said heating means is removed during an excess solder removing and cooling cycle.

2. The apparatus in accordance with claim 1, wherein said movable supporting means is adjustable for differently sized PCBs.

3. The apparatus in accordance with claim 1, wherein said control means comprises a computer and a solenoid, said solenoid actuating said heating means and said means for supplying air under the control of said computer.

4. The apparatus in accordance with claim 1, wherein said control means comprises a timing device and a solenoid, said solenoid actuating said heating means and said means for supplying air under the control of said timing device.

5. The apparatus in accordance with claim 1, further comprising means for collecting melted solder disposed below said PCB.

6. An apparatus for reworking a defective printed circuit board (PCB) having solder-plugged plated through holes (PTHs), comprising:

movable supporting means for carrying said defective PCB containing solder-plugged plated through holes to be reworked, said movable supporting means being movable to center a defective area of said PCB below an air supplying means;

air supplying means disposed above said defective PCB to supply air under pressure to said solder-plugged plated through holes of said defective area of said PCB to remove excess solder from said solder-plugged plated through holes of said defective area, and to cool said PCB;

heat protective means surrounding said defective area of said PCB to prevent solder splashing upon, and damage to, non-defective areas of said PCB;

heating means disposed below said solder-plugged plated through holes of said defective area of said PCB for locally heating said defective area to cause the solder in said solder-plugged plated through holes to melt; and control means operatively connected to said heating means and to said means for supplying air, said control means operatively controlling said heating means and said means for supplying air in a proper operational sequence, so that said heating means is removed during an excess solder removing and cooling cycle.

7. The apparatus in accordance with claim 6, wherein said movable supporting means is adjustable for differently sized PCBs.

8. The apparatus in accordance with claim 6, wherein said control means comprises a computer and a solenoid, said solenoid actuating said heating means and said means for supplying air under the control of said computer.

9. The apparatus in accordance with claim 6, wherein said control means comprises a timing device and a solenoid, said solenoid actuating said heating means and said means for supplying air under the control of said timing device.

10. The apparatus in accordance with claim 6, further comprising means for collecting melted solder disposed below said PCB.

* * * * *